(12) United States Patent
Onishi

(10) Patent No.: US 9,437,727 B2
(45) Date of Patent: Sep. 6, 2016

(54) SEMICONDUCTOR ELEMENT INCLUDING ACTIVE REGION, LOW RESISTANCE LAYER AND VERTICAL DRIFT PORTION

(71) Applicant: FUJI ELECTRIC CO., LTD., Kawasaki-shi (JP)

(72) Inventor: Yasuhiko Onishi, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/643,651

(22) Filed: Mar. 10, 2015

(65) Prior Publication Data

US 2015/0187930 A1 Jul. 2, 2015

Related U.S. Application Data

(63) Continuation of application No. PCT/JP2013/082747, filed on Dec. 5, 2013.

(30) Foreign Application Priority Data

Jan. 16, 2013 (JP) ................................. 2013-005811

(51) Int. Cl.
H01L 29/06 (2006.01)
H01L 29/78 (2006.01)
H01L 29/10 (2006.01)
(Continued)

(52) U.S. Cl.
CPC ......... *H01L 29/7811* (2013.01); *H01L 29/063* (2013.01); *H01L 29/0634* (2013.01); *H01L 29/1095* (2013.01); *H01L 21/263* (2013.01); *H01L 21/26506* (2013.01); *H01L 29/0638* (2013.01); *H01L 29/402* (2013.01)

(58) Field of Classification Search
CPC ............. H01L 29/0611; H01L 29/402; H01L 29/1095; H01L 29/7811
See application file for complete search history.

(56) References Cited

U.S. PATENT DOCUMENTS 5,216,275 A 6/1993 Chen
5,438,215 A 8/1995 Tihanyi
(Continued)

FOREIGN PATENT DOCUMENTS

JP 07-007154 A 1/1995
JP 09-266311 A 10/1997
(Continued)

OTHER PUBLICATIONS

International Search Report issued in PCT/JP2013/082747, dated Mar. 11, 2014, English translation provided.

*Primary Examiner* — Thanh V Pham
(74) *Attorney, Agent, or Firm* — Rossi, Kimms & McDowell LLP

(57) ABSTRACT

A drain drift portion is a first parallel p-n structure, largely corresponding to a portion directly below a p-type base region forming an active region, formed by first n-type regions and first p-type regions being alternately and repeatedly joined. The periphery of the drain drift portion is an edge termination region formed of a second parallel p-n structure aligned contiguously to the first parallel p-n structure and formed by second n-type regions and second p-type regions being alternately and repeatedly joined. An n-type buffer layer is provided between the first and second parallel p-n structures and an $n^+$ type drain layer. A $p^+$ type drain region is selectively provided inside the $n^+$ type drain layer in the edge termination region, penetrating the $n^+$ type drain layer in the depth direction.

12 Claims, 5 Drawing Sheets

(51) Int. Cl.
 *H01L 29/40* (2006.01)
 *H01L 21/263* (2006.01)
 *H01L 21/265* (2006.01)

(56) References Cited

U.S. PATENT DOCUMENTS 6,097,063 A  8/2000  Fujihira

2003/0176031 A1  9/2003  Onishi et al.
2009/0289276 A1  11/2009  Yoshiura et al.

FOREIGN PATENT DOCUMENTS

| JP | 2003-224273 A | 8/2003 |
| JP | 2004-022716 A | 1/2004 |
| JP | 3925319 B2 | 6/2007 |
| JP | 2009-283781 A | 12/2009 |
| JP | 4743447 B2 | 8/2011 |

US 9,437,727 B2

SEMICONDUCTOR ELEMENT INCLUDING ACTIVE REGION, LOW RESISTANCE LAYER AND VERTICAL DRIFT PORTION

CROSS-REFERENCE TO RELATED APPLICATIONS

This application is a continuation of International Application No. PCT/JP 2013/082747, filed on Dec. 5, 2013, which is based on and claims priority to Japanese Patent Application No. JP 2013-005811, filed on Jan. 16, 2013. The disclosure of the Japanese priority application and the PCT application in their entirety, including the drawings, claims, and the specification thereof, are incorporated herein by reference.

BACKGROUND OF THE INVENTION

1. Field of the Invention

The present invention relates to a semiconductor device.

2. Related Art

Generally, semiconductor devices are categorized into lateral semiconductor devices, which have an electrode on one surface, and vertical semiconductor devices, which have an electrode on both surfaces. Vertical semiconductor devices are such that the direction in which a drift current flows when in an on-state and the direction in which a depletion layer caused by reverse bias voltage extends when in an off-state are the same. For example, an n-channel vertical MOSFET (MOSFET: Metal Oxide Semiconductor Field Effect Transistor) with a normal planar gate structure is such that, when in an on-state, a portion of a high-resistance n$^-$ type drift layer functions as a region that causes drift current to flow in a vertical direction. Consequently, as drift resistance is lowered by shortening the current path of the n$^-$ type drift layer, an advantage is obtained in that it is possible to lower the practical on-state resistance of the MOSFET.

Meanwhile, a portion of the high-resistance n$^-$ type drift layer depletes when in an off-state, increasing breakdown voltage. Consequently, when the n$^-$ type drift layer is thinner, the spread of a drain-to-base depletion layer advancing from a p-n junction between a p-type base region and the n$^-$ type drift layer is reduced, and the critical electrical field strength of the silicon is quickly reached, because of which breakdown voltage drops. Conversely, a semiconductor device with high breakdown voltage is such that the n$^-$ type drift layer is thick, because of which the on-state resistance increases, and loss increases. In this way, there is a trade-off relationship between on-state resistance and breakdown voltage.

It is known that this trade-off relationship is also established in the same way in a semiconductor device such as an IGBT (Insulated Gate Bipolar Transistor), bipolar transistor, or diode. Also, trade-off relationship is also common to lateral semiconductor devices, wherein the direction in which a drift current flows when in an on-state and the direction in which a depletion layer caused by reverse bias extends when in an off-state are different.

A superjunction semiconductor device wherein the drift layer is a parallel p-n structure, of a configuration wherein n-type drift regions with increased impurity concentration and p-type isolation regions are alternately and repeatedly joined, is commonly known as a method of resolving the problem of the trade-off relationship. See, for example, U.S. Pat. No. 5,216,275 (also referred to herein as "PTL 1"), U.S. Pat. No. 5,438,215 (also referred to herein as "PTL 2") and Japanese Patent Application Publication No. JP-A-9-266311 (also referred to herein as "PTL 3"). A semiconductor device with this kind of structure is such that, even when the impurity concentration of the parallel p-n structure is high, a depletion layer spreads laterally from each vertically extending p-n junction of the parallel p-n structure when in an off-state, depleting the whole of the drift layer, because of which it is possible to achieve an increase in breakdown voltage.

Meanwhile, in the case of a semiconductor device including a diode, or a circuit utilizing a parasitic diode incorporated in a MOSFET or the like, as with a bridge circuit, it is necessary to ensure that the device is not destroyed even when high di/dt occurs during a diode reverse recovery process. Increasing breakdown withstand by shortening the carrier lifetime of an edge termination region parallel p-n structure in comparison with the carrier lifetime of an active region parallel p-n structure, thereby reducing the current flowing from the edge termination region toward the active region, has been proposed as a method of resolving this kind of problem. See, for example, Japanese Patent Application Publication No. JP-A-2003-224273 (also referred to herein as "PTL 4"), Japanese Patent Application Publication No. JP-A-2004-22716 (also referred to herein as "PTL 5"), Japanese Patent No. 4,743,447 (also referred to herein as "PTL 6") and Japanese Patent No. 3,925,319 (also referred to herein as "PTL 7"). In PTL 6, there is a description of integrating a diode and MOSFET, but there is no description of forming a p-type region in a drain region opposing an edge termination region of the MOSFET.

A description will be given of the configuration of an existing superjunction MOSFET to which localized lifetime technology is applied in this way. FIG. 5 is a sectional view showing the structure of an existing vertical MOSFET. FIG. 5 is FIG. 12 of PTL 5. As shown in FIG. 5, a drain drift portion 102 of a first parallel p-n structure is provided on a low-resistance n$^+$ type drain layer 101 with which a back side drain electrode 113 is in contact electrically. A p-type base region 103 with a high impurity concentration, forming an active region 121, is selectively provided in a surface layer of the drain drift portion 102.

The drain drift portion 102 is a first parallel p-n structure, roughly corresponding to a portion directly below the multiple wells of the p-type base region 103 forming the active region 121, formed by layer form vertical first n-type regions 102a oriented in the thickness direction of the substrate and layer form vertical first p-type regions 102b oriented in the thickness direction of the substrate being alternately and repeatedly joined in a direction along the surface of the substrate at a repetition pitch P101. A MOS gate (an insulated gate formed of metal-oxide-semiconductor) structure formed of the p-type base region 103, a p$^+$ type contact region 105, n$^+$ type source region 106, gate dielectric 107, and gate electrode layer 108, and a source electrode 110, are provided on the substrate front surface side of the first parallel p-n structure. Reference sign 109 is an interlayer dielectric.

The periphery of the drain drift portion 102 is an edge termination region 122 formed of a second parallel p-n structure. The edge termination region 122 is contiguous with the first parallel p-n structure of the drain drift portion 102, and is formed by layer form vertical second n-type regions 112a oriented in the thickness direction of the substrate and layer form vertical second p-type regions 112b oriented in the thickness direction of the substrate being alternately and repeatedly joined in a direction along the surface of the substrate at the repetition pitch P101. The first parallel p-n structure and second parallel p-n structure are such that the repetition pitch P101 is practically the same, and the impurity concentration is also practically the same.

An oxide film 115 is provided on a surface of the second parallel p-n structure. A field plate electrode FP extended from the source electrode 110 is formed on the oxide film 115, covering the second parallel p-n structure. An n-type channel stopper region 114 connected to an n$^+$ type drain layer 101 is formed on the exterior of the edge termination region 122, and a stopper electrode 116 is in contact electrically with the n-type channel stopper region 114. The second parallel p-n structure and n-type channel stopper region 114 are regions with a carrier lifetime shorter than that of the first parallel p-n structure.

However, in PTL 4 to 7, the amount of carriers accumulated in the edge termination region 122 is reduced by the carrier lifetime of the second parallel p-n structure of the edge termination region 122 being shortened in comparison with the carrier lifetime of the first parallel p-n structure of the active region 121, thereby increasing breakdown withstand with respect to a localized concentration of reverse recovery current during a reverse recovery process of a parasitic diode formed of the first p-type regions 102b and first n-type regions 102a, but there is a problem in that the leakage current when in an off-state increases due to the carrier lifetime of the second parallel p-n structure of the edge termination region 122 being shortened, as a result of which loss increases. Also, there is a problem in that when the leakage current in an off-state increases too far, the device is destroyed by thermal runaway.

SUMMARY OF THE INVENTION

The invention, in order to resolve the problems of the heretofore described existing technology, has an object of providing a semiconductor device such that it is possible to increase breakdown withstand, using a superjunction semiconductor device wherein it is possible to considerably improve the trade-off relationship between on-state resistance and breakdown voltage.

In order to resolve the heretofore described problems, thus achieving the object of the invention, a semiconductor device according to the invention has the following characteristics. The semiconductor device has an active region, existing on a first main side of a substrate, that causes current to flow actively or passively, a first conductivity type low resistance layer that exists in a surface layer on a second main surface side of the substrate, and a vertical drift portion, interposed between the active region and the first conductivity type low resistance layer, through which a drift current flows in a vertical direction in an on-state and which depletes in an off-state. The vertical drift portion forms a first parallel p-n structure formed by first vertical first conductivity type regions oriented in the thickness direction of the substrate and first vertical second conductivity type regions oriented in the thickness direction of the substrate being alternately and repeatedly joined. The semiconductor device has an edge termination region, interposed between the first main surface and first conductivity type low resistance layer on the periphery of the vertical drift portion, that is substantially a non-current path region in an on-state and depletes in an off-state. A first conductivity type layer that has resistance higher than that of the first conductivity type low resistance layer is provided from the active region to the edge termination region between the first parallel p-n structure and first conductivity type low resistance layer. A second conductivity type low resistance layer is selectively provided in a surface layer on the second main surface side in the edge termination region. An output electrode in contact with the first conductivity type low resistance layer and second conductivity type low resistance layer is provided.

Also, the heretofore described aspect of the semiconductor device according to the invention is characterized in that the impurity concentration of the second conductivity type low resistance layer is higher than the impurity concentration of the first conductivity type layer.

Also, the heretofore described aspect of the semiconductor device according to the invention is characterized in that the impurity concentration of the second conductivity type low resistance layer is higher than the impurity concentration of the first conductivity type low resistance layer.

Also, the heretofore described aspect of the semiconductor device according to the invention is characterized by further having a plurality of second conductivity type base regions provided on the first main surface side. Further, an inner end portion of the second conductivity type low resistance layer is positioned at the boundary of the active region and edge termination region. An outer end portion of the second conductivity type low resistance layer is positioned separated outward from an outer end portion of the second conductivity type base region of the plurality of second conductivity type base regions provided farthest to the exterior by the thickness of the vertical drift portion or more.

Also, the heretofore described aspect of the semiconductor device according to the invention is characterized in that the second conductivity type low resistance layer is provided from the boundary of the active region and edge termination region to the periphery of the edge termination region.

Also, the heretofore described aspect of the semiconductor device according to the invention is characterized in that the second conductivity type low resistance layer is provided in a surface layer on the second main surface side of the first conductivity type low resistance layer. The first conductivity type low resistance layer is interposed between the second conductivity type low resistance layer and the first conductivity type layer.

Also, the heretofore described aspect of the semiconductor device according to the invention is characterized in that the edge termination region forms a second parallel p-n structure formed by second vertical first conductivity type regions oriented in the thickness direction of the substrate and second vertical second conductivity type regions oriented in the thickness direction of the substrate being alternately and repeatedly joined.

According to the invention, the volume of an n$^+$ type drain layer (the first conductivity type low resistance layer) in an edge termination region is reduced by a p$^+$ type drain region (the second conductivity type low resistance layer) being selectively provided inside the n$^+$ type drain layer in the edge termination region, because of which the injection of electrons from the n$^+$ type drain layer on the substrate back surface side into a second parallel p-n structure is suppressed, together with which the injection of holes from an outermost p-type base region on the substrate front surface side into the second parallel p-n structure is suppressed. Because of this, it is possible to reduce the amount of carriers accumulated in the edge termination region, and thus possible to alleviate the concentration of current flowing into the outermost p-type base region during a parasitic diode reverse recovery process. Consequently, it is possible to increase reverse recovery capability (breakdown withstand).

According to the semiconductor device according to the invention, an advantage is achieved in that it is possible to increase breakdown withstand.

DETAILED DESCRIPTION

Hereafter, referring to the attached drawings, a detailed description will be given of preferred embodiments of a semiconductor device according to the invention. In the description and attached drawings, a layer or region being prefixed by n or p means that electrons or holes respectively are majority carriers. Also, + or − attached to n or p means a higher impurity concentration or lower impurity concentration respectively than in a layer or region to which + or − is not attached. In the following description of the embodiments and in the attached drawings, the same reference signs are given to the same configurations, and redundant descriptions are omitted.

Embodiment 1

Figure 1:
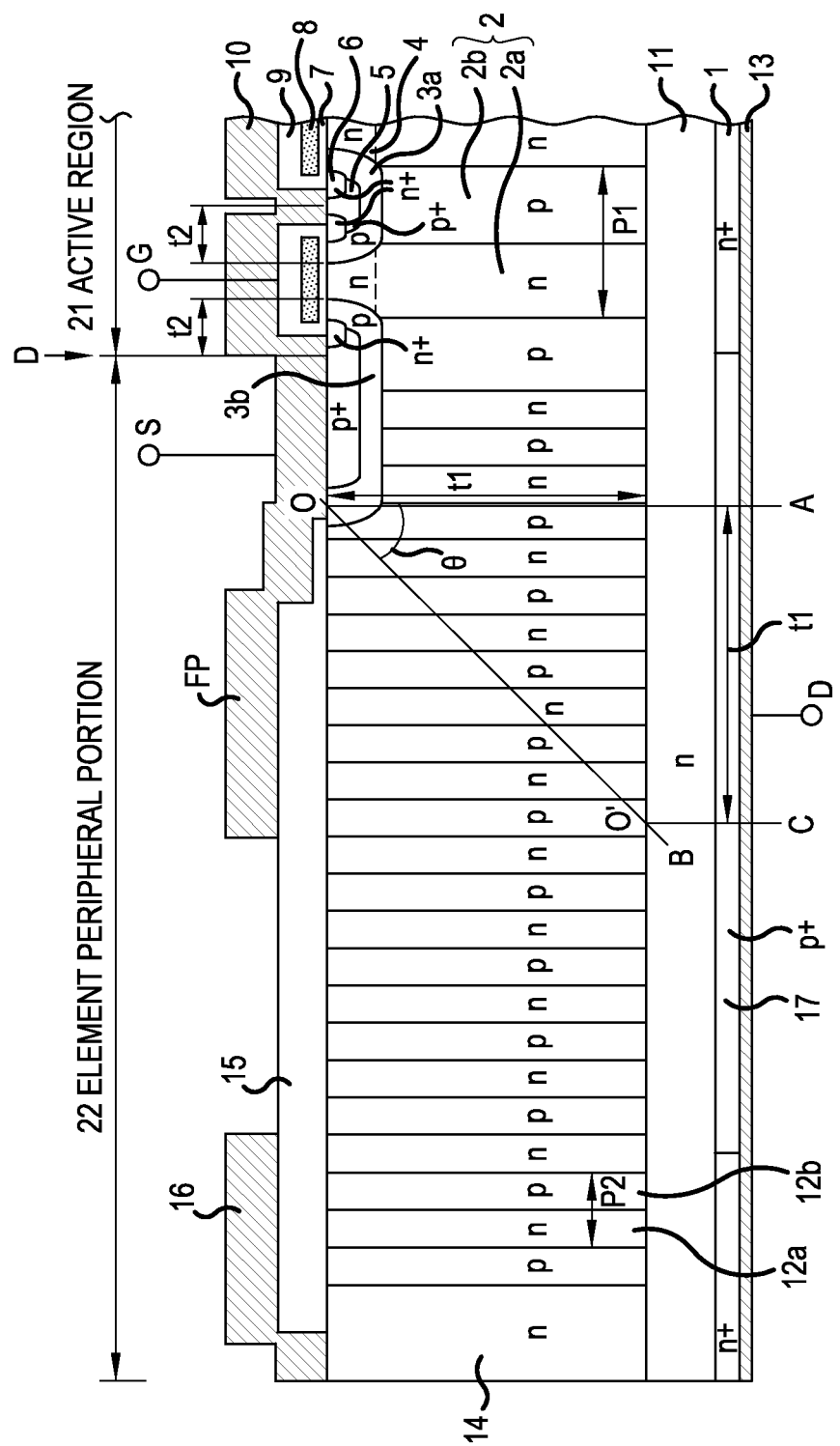
FIG. 1 is a sectional view showing the structure of a semiconductor device according to Embodiment 1.

A description will be given of the structure of a semiconductor device according to Embodiment 1, using an n-channel vertical MOSFET with a planar gate structure as an example. FIG. 1 is a sectional view showing the structure of the semiconductor device according to Embodiment 1. The semiconductor device according to Embodiment 1 shown in FIG. 1 is a superjunction MOSFET including a drain drift portion (vertical drift portion) 2 of a first parallel p-n structure. A p-type base region 3a with a high impurity concentration, which forms an active region 21, is selectively provided in a surface layer on one surface side (hereafter taken to be a substrate front surface side) of the drain drift portion 2. The substrate is an epitaxial substrate, to be described hereafter.

A $p^+$ type contact region 5 and $n^+$ type source region 6 with high impurity concentrations are selectively provided on the substrate front surface side inside the p-type base region 3a. The $n^+$ type source region 6 is formed more shallowly than the $p^+$ type contact region 5 in the well-form p-type base region 3a, configuring a double-diffused MOS portion. A gate electrode layer 8 of polysilicon or the like is provided across a gate dielectric 7 on a portion of the surface of the p-type base region 3a sandwiched by the drain drift portion 2 and $n^+$ type source region 6. A source electrode 10 is in contact electrically astraddle the p-type base region 3a and $n^+$ type source region 6 via a contact hole opened in an interlayer dielectric 9.

The drain drift portion 2 is a first parallel p-n structure, largely corresponding to a portion directly below the multiple wells of the p-type base region 3a forming the active region 21, formed by layer form vertical first n-type regions (first vertical first conductivity type regions) 2a oriented in the thickness direction of the substrate and layer form vertical first p-type regions (first vertical second conductivity type regions) 2b oriented in the thickness direction of the substrate being alternately and repeatedly joined in a direction along the surface of the substrate at a repetition pitch P1.

One of the first n-type regions 2a is such that the upper end thereof (an end portion on the substrate front surface side) reaches a surface n-type drift region 4, which is a region sandwiched by the p-type base region 3a, while the lower end thereof (an end portion on the substrate back surface side) is in contact with an n-type buffer layer 11. The first n-type region 2a that reaches the surface n-type drift region 4 is a current path region in an on-state, but the remainder of the first n-type regions 2a are substantially non-current path regions. Also, the first p-type regions 2b are such that the upper ends thereof are in contact with the well bottom surface of the p-type base region 3a, while the lower ends thereof are in contact with the n-type buffer layer 11.

The periphery of the drain drift portion 2 is an edge termination region 22 formed of a second parallel p-n structure. The edge termination region 22 is contiguous with the first parallel p-n structure of the drain drift portion 2, and is formed by layer form vertical second n-type regions (second vertical first conductivity type regions) 12a oriented in the thickness direction of the substrate and layer form vertical second p-type regions (second vertical second conductivity type regions) 12b oriented in the thickness direction of the substrate being alternately and repeatedly joined in a direction along the surface of the substrate at a repetition pitch P2.

The second parallel p-n structure is provided in order to easily realize increased breakdown voltage (in order that a depletion layer spreads easily when in an off-state). The impurity concentration of the second parallel p-n structure is lower than the impurity concentration of the first parallel p-n structure. The repetition pitch P2 of the second parallel p-n structure is narrower than the repetition pitch P1 of the first parallel p-n structure. An oxide film 15 is provided on a surface (substrate front surface side) of the second parallel p-n structure.

The oxide film 15 is formed so that the thickness thereof gradually increases from the drain drift portion 2 toward the edge termination region 22. A field plate electrode FP extended from the source electrode 10 is formed on the oxide film 15, covering the second parallel p-n structure. An n-type channel stopper region 14 is formed on the exterior of the edge termination region 22, and a stopper electrode 16 is in contact electrically with the substrate front surface side of the n-type channel stopper region 14.

The n-type buffer layer 11 is provided on the other surface (on the substrate back surface side) of the drain drift portion 2. The n-type buffer layer 11 is extended as far as the outer periphery (substrate side surface) of the edge termination region 22, and connected to the n-type channel stopper region 14. The n-type buffer layer 11 is a carrier accumulation layer when a parasitic diode formed of the first p-type regions 2b and first n-type regions 2a experiences reverse recovery (the parasitic diode is impressed from a forward direction to a reverse direction in a state wherein the gate and source are short-circuited).

The impurity concentration of the n-type buffer layer 11 is set so that a drain-to-base depletion layer does not reach an $n^+$ type drain layer (first conductivity type low resistance layer) 1 or $p^+$ type drain region (second conductivity type low resistance layer) 17, to be described hereafter, when in an off-state. By adopting a configuration wherein the drain-to-base depletion layer does not reach the $p^+$ type drain region 17 when in an off-state, a parasitic PNP transistor formed of an outermost p-type base region 3b, the second parallel p-n structure, n-type buffer layer 11, and p+ type drain region 17 does not operate, because of which it is possible to reduce the amount of carriers accumulated in the edge termination region 22.

The n+ type drain layer 1 is provided in a surface layer on the substrate back surface side of the n-type buffer layer 11 in the active region 21. The p+ type drain region 17 is selectively provided in a surface layer on the substrate back surface side of the n-type buffer layer 11 in the edge termination region 22. The n+ type drain layer 1 is provided in portions other than the p+ type drain region 17 of the surface layer on the substrate back surface side of the n-type buffer layer 11. The p+ type drain region 17 has a function of suppressing an injection of electrons from the n+ type drain layer 1 to the second parallel p-n structure on the substrate back surface side when there is forward conduction in the parasitic diode. The n+ type drain layer 1 and p+ type drain region 17 are in contact electrically with a drain electrode (output electrode) 13.

It is preferable that the outer end portion of the p+ type drain region 17 is positioned separated outward from the position of a vertical line A-O, which passes through an outer end portion of the bottom surface of the p-type base region 3b farthest to the exterior (hereafter referred to as the outermost p-type base region) and is perpendicular to the substrate back surface, by a distance t1 between the substrate front surface and n-type buffer layer 11 (that is, the thickness of the second parallel p-n structure), or more. The reason for this is as follows. An outward spread (diffusion) θ of holes injected from the outermost p-type base region 3b into the second parallel p-n structure is at 45 degrees to the normal at the boundary between the outermost p-type base region 3b and second parallel p-n structure. That is, holes injected from the outermost p-type base region 3b into the second parallel p-n structure pass through an intersection O of the vertical line A-O and the substrate front surface, and a large number are injected within a range as far as a diagonal line B-O inclined 45 degrees outward from the vertical line A-O. The reason that carriers accumulate in the edge termination region 22 is that electrons are injected from the n+ type drain layer 1 on the substrate back surface side into the second parallel p-n structure in response to the holes implanted from the outermost p-type base region 3b on the substrate front surface side into the second parallel p-n structure. Because of this, the outer end portion of the p+ type drain region 17 is extended outward so that the p+ type drain region 17 exists from the vertical line A-O to a vertical line C-O' that passes through an intersection O' of the boundary between the second parallel p-n structure and n-type buffer layer 11 and the diagonal line B-O and is perpendicular to the substrate back surface, that is, in a portion the distance t1 from the vertical line A-O. Because of this, it is possible to reduce the volume of the n+ type drain layer 1 in a range in which the amount of holes injected from the outermost p-type base region 3b is large, and thus possible to effectively suppress the injection of electrons from the n+ type drain layer 1 into the second parallel p-n structure.

Also, it is preferable that the inner end portion of the p+ type drain region 17 is positioned at the boundary between the active region 21 and edge termination region 22. The reason for this is that it is possible to reduce the volume of the n+ type drain layer 1 in the vicinity of the substrate back surface side opposing the high-Electric field outermost p-type base region 3b across the second parallel p-n structure, and thus possible to further reduce the electrons injected from the n+ type drain layer 1 into the second parallel p-n structure. Consequently, it is preferable that the p+ type drain region 17 is provided at least from the boundary between the active region 21 and edge termination region 22 to the vertical line C-O'. The boundary between the active region 21 and edge termination region 22 is a position D separated outward from the substrate front surface side inner end portion of the outermost p-type base region 3b by a width t2, which is half the substrate front surface side width of the p-type base region 3a.

Although not particularly limited, when the superjunction MOSFET according to Embodiment 1 is of, for example, a 600V breakdown voltage class, the dimensions and impurity concentrations of each portion have the following values. The thickness (depth direction) of the drain drift portion 2 is 35.0 μm, the width of the first n-type region 2a and the first p-type region 2b is 7.0 μm (the repetitive pitch P1 is 14.0 μm), and the impurity concentration of the first n-type region 2a and the first p-type region 2b is $3.0 \times 10^{15}$ cm$^{-3}$. The width of the second n-type region 12a and the second p-type region 12b is 3.5 μm (the repetitive pitch P2 is 7.0 μm), and the impurity concentration of the second n-type region 12a and the second p-type region 12b is $1.0 \times 10^{15}$ cm$^{-3}$.

The diffusion depth of the p-type base regions 3a and 3b is 3.0 μm, and the surface impurity concentration thereof is $3.0 \times 10^{17}$ cm$^{-3}$. The diffusion depth of the n+ type source region 6 is 0.2 μm, and the surface impurity concentration thereof is $3.0 \times 10^{20}$ cm$^{-3}$. The diffusion depth of the p+ type contact region 5 is 0.6 μm, and the surface impurity concentration thereof is $1.0 \times 10^{19}$ cm$^{-3}$. The diffusion depth of the surface n-type drift region 4 is 2.5 μm, and the surface impurity concentration thereof is $2.0 \times 10^{16}$ cm$^{-3}$. The thickness of the n+ type drain layer 1 is 0.5 μm, and the impurity concentration thereof is $1.0 \times 10^{19}$ cm$^{-3}$. The thickness of the p+ type drain region 17 is 0.5 μm, and the impurity concentration thereof is $1.0 \times 10^{18}$ cm$^{-3}$. The thickness of the n-type buffer layer 11 is 7 μm, and the impurity concentration thereof is $1.0 \times 10^{15}$ cm$^{-3}$. The width of the n-type channel stopper region 14 is 30.0 μm, and the impurity concentration thereof is $6.0 \times 10^{15}$ cm$^{-3}$.

To be exact, the heretofore mentioned parallel p-n structure impurity concentrations (impurity amounts) mean carrier concentrations (carrier amounts). Generally, the impurity concentration and carrier concentration are seen as being equal in a region in which sufficient activation has been carried out. In the same way, the impurity amount and carrier amount are seen as being equal in a region in which sufficient activation has been carried out. Consequently, in the description, for the sake of convenience, it is assumed that carrier concentration is included in impurity concentration, and assumed that carrier amount is included in impurity amount.

Next, a description will be given of the electrical characteristics of the superjunction semiconductor device according to Embodiment 1. Normally, a superjunction MOSFET is such that, when a parasitic diode formed of a first p-type region and first n-type region experiences reverse recovery, a first parallel p-n structure is pinched-off, simultaneously with which accumulated carriers are expelled into a p-type base region and an n+ type drain layer. Because of this, when the parasitic diode experiences reverse recovery, the carriers deplete in an active region. Meanwhile, in an edge termination region, a depletion layer gradually spreads in accompaniment to a rise in the applied voltage, because of which there occurs a state wherein carriers (accumulated carriers) remain in a neutral region. Further, as the depletion layer spreads toward the exterior of the edge termination region, the accumulated carriers remaining in the neutral region flow concentrated into a high-Electric field p-type base region farthest to the exterior (hereafter referred to as the outermost p-type base region), because of which reverse recovery capability is limited.

Figure 5:
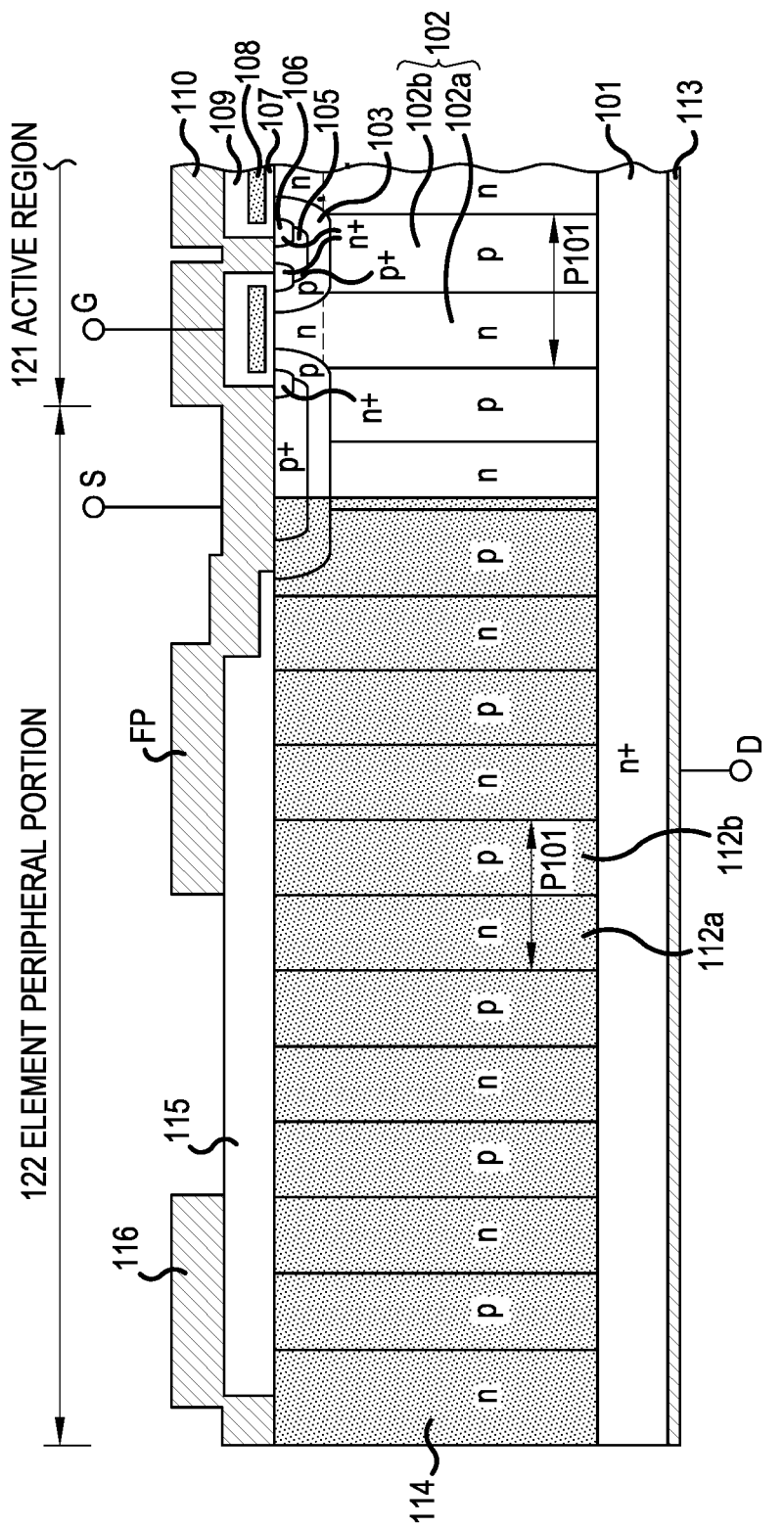
FIG. 5 is a sectional view showing the structure of an existing vertical MOSFET.

The reason that carriers are accumulated in the edge termination region is that electrons are injected from the n⁺ type drain layer on the substrate back surface side into a second parallel p-n structure in response to holes injection from the outermost p-type base region on the substrate front surface side into the second parallel p-n structure, as heretofore described. Because of this, provided that it is possible to suppress the injection of electrons from the n⁺ type drain layer on the substrate back surface side into the second parallel p-n structure, the amount of carriers accumulated in the edge termination region is reduced, and it is thus possible to alleviate the concentration of current flowing into the outermost p-type base region. For example, the existing superjunction MOSFET shown in FIG. 5 is such that, by applying localized lifetime technology whereby crystal defects forming a lifetime killer are introduced into the edge termination region 122 by irradiating with electron beams, helium (He), protons (H⁺), or the like, thus shortening the carrier lifetime of a second parallel p-n structure of the edge termination region 122 in comparison with the carrier lifetime of a first parallel p-n structure of the active region 121 and promoting recombination of the accumulated carriers, the amount of carriers accumulated in the edge termination region 122 is reduced.

Meanwhile, the superjunction MOSFET according to Embodiment 1 is such that, by one portion of the n⁺ type drain layer 1 in the edge termination region 22 becoming the P⁺ type drain region 17, thereby reducing the volume of the n⁺ type drain layer 1, the injection of electrons from the p⁺ type drain region 17 into the second parallel p-n structure is suppressed, thus reducing the amount of carriers accumulated in the edge termination region 22. Also, the superjunction MOSFET according to Embodiment 1 is such that, as the carrier lifetime of the second parallel p-n structure of the edge termination region 22 is not shortened in comparison with the carrier lifetime of the first parallel p-n structure of the active region 21, there is little leakage current when in an off-state, and it is thus possible to achieve low loss. Even assuming provisionally that the carrier lifetime of the whole of the first and second parallel p-n structures is shortened, there is no need to shorten the carrier lifetime of the second parallel p-n structure of the edge termination region 22 as far as in the case of the existing superjunction MOSFET, wherein the carrier lifetime of the second parallel p-n structure of the edge termination region is shortened by applying localized lifetime technology, because of which it is possible to prevent the leakage current when in an off-state from increasing markedly.

Next, a description will be given of a method of manufacturing the superjunction MOSFET according to Embodiment 1. Firstly, the first and second parallel p-n structures and the n-type channel stopper region 14 are formed using a general multilayer epitaxial growth method on the front surface side of an n-type semiconductor substrate of a thickness of in the region of, for example, 600 μm formed of the n-type buffer layer 11, or of a low resistance layer and the n-type buffer layer 11. Specifically, firstly, an n-type epitaxial layer is grown on the n-type buffer layer 11. Next, a screen oxide film (not shown) is formed on the n-type epitaxial layer, and an n-type impurity such as, for example, phosphorus (P) is ion implanted into the whole of the n-type epitaxial layer from above the screen oxide film.

Next, a resist mask (not shown), in which portions corresponding to formation regions of the first and second p-type regions 2b and 12b are opened based on the repetitive pitches P1 and P2 of the first and second parallel p-n structures, is formed on the n-type epitaxial layer. Next, a p-type impurity such as, for example, boron is ion implanted from above the screen oxide film into the n-type epitaxial layer exposed in the opened portions of the resist mask, thereby selectively forming a p-type impurity region inside the n-type epitaxial layer. Further, after repeatedly carrying out the process from the step of growing the n-type epitaxial layer to the step of forming the p-type impurity region inside the n-type epitaxial layer a predetermined number of times (a multilayer epitaxial process), a sealing n-type epitaxial layer is further deposited on the outermost surface (a cap deposition process).

Next, after the oxide film 15 is formed on the sealing n-type epitaxial layer, each p-type impurity region formed inside the n-type epitaxial layers is activated by thermal processing. Owing to the activation process, p-type impurity regions opposed in the depth direction are linked between the n-type epitaxial layers deposited by the multilayer epitaxial process, forming the first and second p-type regions 2b and 12b. Also, n-type epitaxial layers remaining between the first and second p-type regions 2b and 12b form the first and second n-type regions 2a and 12a. Because of this, the first and second parallel p-n structures are formed.

By the steps thus far, an epitaxial substrate formed by the first and second parallel p-n structures and the n-type channel stopper region 14 being deposited on the n-type semiconductor substrate forming the n-type buffer layer 11 is fabricated. Next, using a general method, the MOS gate structure and front surface electrodes (the source electrode 10 and the like) of the active region 21 are formed on the front surface side of the epitaxial substrate. Next, the back surface (the surface on the n-type buffer layer 11 side) of the epitaxial substrate is ground, reducing the thickness of the epitaxial substrate to in the region of, for example, 50 μm.

Next, a resist mask in which portions corresponding to formation regions of the n⁺ type drain layer 1 are opened is formed on the back surface (the surface on the n-type buffer layer 11 side) of the epitaxial substrate. Next, with the resist mask as a mask, an n-type impurity is ion implanted, thereby forming the n⁺ type drain layer 1 in a surface layer of the back surface of the epitaxial substrate. Further, the resist mask used for forming the n⁺ type drain layer 1 is removed. Next, a resist mask covering the n⁺ type drain layer 1, and in which a portion corresponding to a formation region of the p⁺ type drain region 17 is opened, is formed on the back surface of the epitaxial substrate.

Next, with the resist mask as a mask, a p-type impurity is ion implanted, thereby forming the p⁺ type drain region 17 in a surface layer of the back surface of the epitaxial substrate. Further, the resist mask used for forming the p⁺ type drain region 17 is removed. The order of the ion implantation for forming the n⁺ type drain layer 1 and the ion implantation for forming the p⁺ type drain region 17 may be reversed. Subsequently, the superjunction MOSFET shown in FIG. 1 is completed by activating the n⁺ type drain layer 1 and p⁺ type drain region 17 using thermal processing.

As heretofore described, according to Embodiment 1, the volume of an n⁺ type drain layer in an edge termination region is reduced by a p⁺ type drain region being selectively provided inside the n⁺ type drain layer in the edge termination region, because of which the injection of electrons from the n⁺ type drain layer on the substrate back surface side into a second parallel p-n structure is suppressed, together with which the injection of holes from an outermost p-type base region on the substrate front surface side into the second parallel p-n structure is suppressed. Because of this, it is possible to reduce the amount of carriers accumulated in the edge termination region, and thus possible to alleviate the concentration of current flowing into the outermost p-type base region during a parasitic diode reverse recovery process. Consequently, it is possible to increase reverse recovery capability (breakdown withstand). Also, as there is no need for the carrier lifetime of the second parallel p-n structure of the edge termination region to be shortened in comparison with the carrier lifetime of a first parallel p-n structure of an active region, as has been the case to date, leakage current when in an off-state decreases in comparison with that to date, and it is thus possible to reduce loss.

Embodiment 2

Figure 2:
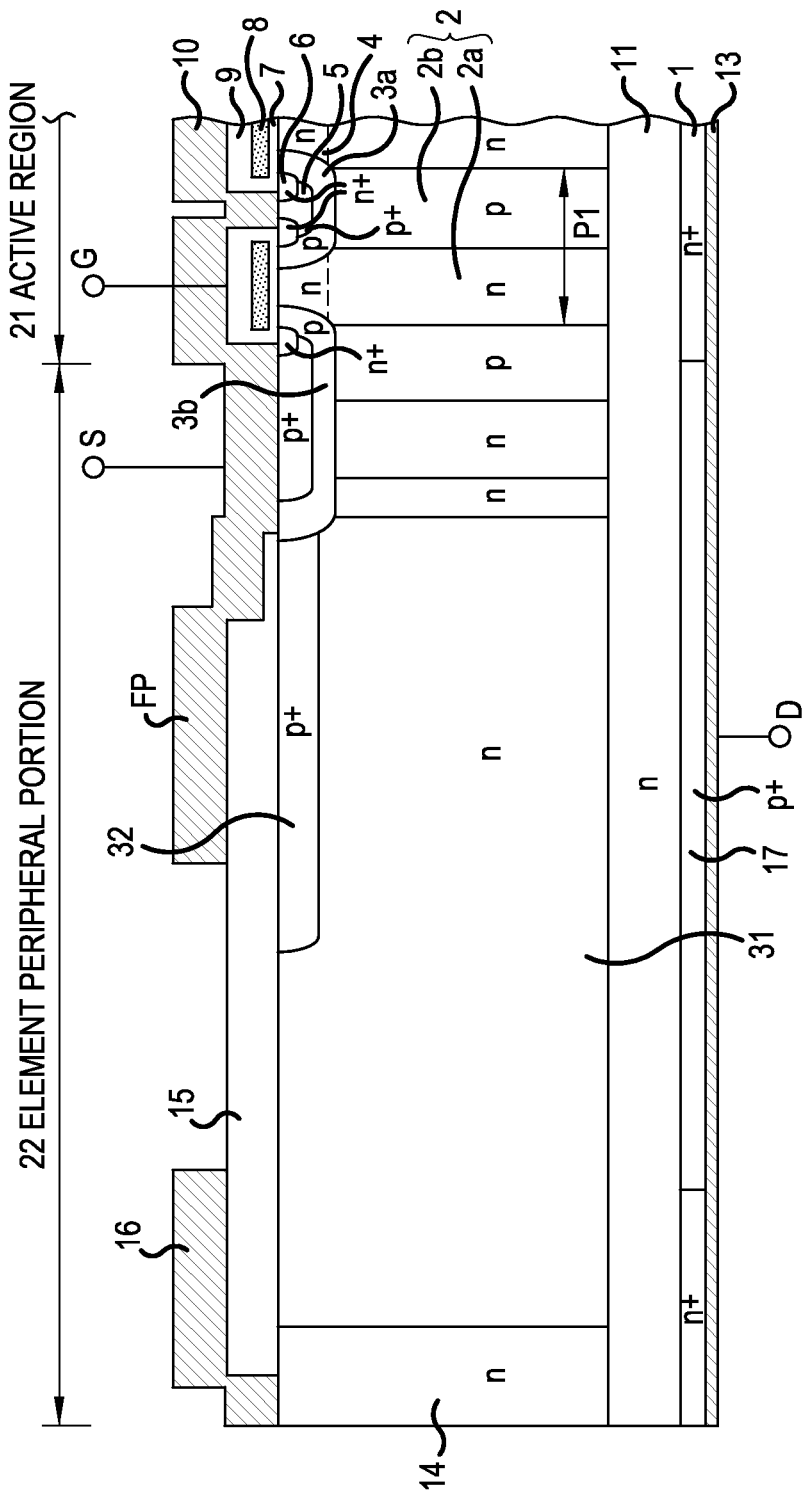
FIG. 2 is a sectional view showing the structure of a semiconductor device according to Embodiment 2.

A description will be given of the structure of a superjunction semiconductor device according to Embodiment 2. FIG. 2 is a sectional view showing the structure of the semiconductor device according to Embodiment 2. The superjunction semiconductor device according to Embodiment 2 differs from the superjunction semiconductor device according to Embodiment 1 in that an n-type bulk region 31 contiguous with a first parallel p-n structure is provided in place of a second parallel p-n structure, and a p-type RESURF region 32 is provided in a surface layer on the substrate front surface side of the n-type bulk region 31.

The n-type bulk region 31 is a region between a first parallel p-n structure provided from the active region 21 to the edge termination region 22 and the n-type channel stopper region 14 provided farthest to the exterior in the edge termination region 22. The p-type RESURF region 32 is selectively provided in a surface layer on the substrate front surface side of the n-type bulk region 31 so as to be in contact with the outermost p-type base region 3b. The oxide film 15 is provided on the surfaces (the surfaces on the substrate front surface side) of the n-type bulk region 31 and p-type RESURF region 32. Configurations other than this of the superjunction semiconductor device according to Embodiment 2 are the same as those of the superjunction semiconductor device according to Embodiment 1.

Next, a description will be given of a method of manufacturing the superjunction MOSFET according to Embodiment 2. In the same way as in Embodiment 1, an epitaxial substrate is fabricated using a general multilayer epitaxial growth method. At this time, the n-type bulk region 31 is formed in place of the second parallel p-n structure in the edge termination region 22 of the epitaxial substrate. Subsequently, the superjunction MOSFET shown in FIG. 2 is completed by the same device structure as in Embodiment 1, and the p-type RESURF region 32, being formed on the front surface side and back surface side of the epitaxial substrate.

As heretofore described, according to Embodiment 2, even when an edge termination region is of a bulk configuration formed of an n-type bulk region, it is possible to obtain the same advantages as in Embodiment 1 provided that one portion of a $p^+$ type drain region is provided in an $n^+$ type drain layer.

Embodiment 3

Figure 3:
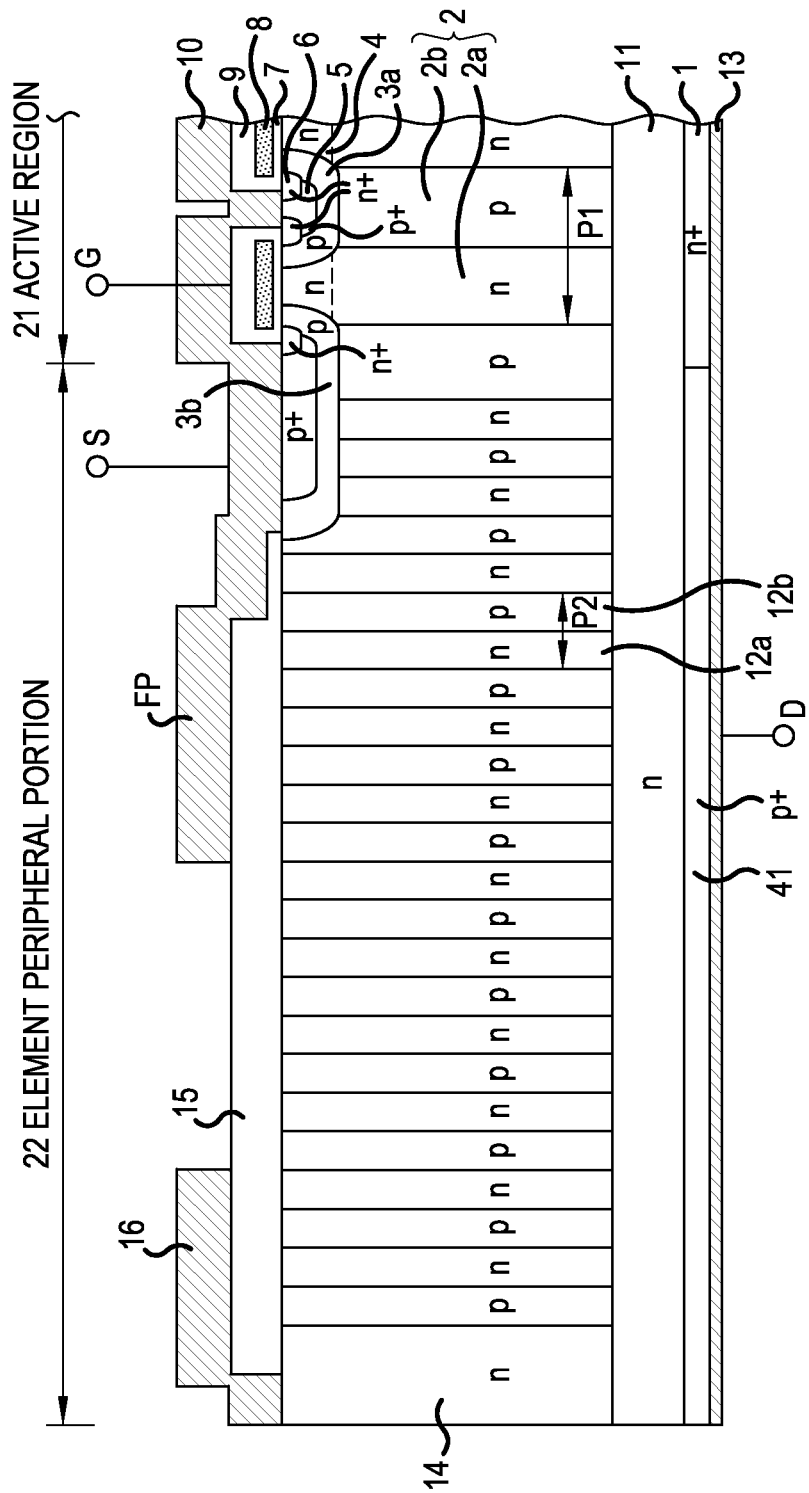
FIG. 3 is a sectional view showing the structure of a semiconductor device according to Embodiment 3.

A description will be given of the structure of a superjunction semiconductor device according to Embodiment 3. FIG. 3 is a sectional view showing the structure of the semiconductor device according to Embodiment 3. The superjunction semiconductor device according to Embodiment 3 differs from the superjunction semiconductor device according to Embodiment 1 in that an outer end portion of a $p^+$ type drain region 41 is extended as far as the outer periphery (a substrate side surface) of the edge termination region 22. Configurations other than this of the superjunction semiconductor device according to Embodiment 3 are the same as those of the superjunction semiconductor device according to Embodiment 1. The method of manufacturing the superjunction MOSFET according to Embodiment 3 is the same as the method of manufacturing the superjunction semiconductor device according to Embodiment 1, except that the formation range of the $p^+$ type drain region 41 differs.

As heretofore described, according to Embodiment 3, it is possible to obtain the same advantages as in Embodiment 1. Also, according to Embodiment 3, the injection of electrons from an $n^+$ type drain layer into a second parallel p-n structure is reduced considerably in comparison with when a $p^+$ type drain region is provided inside one portion of the $n^+$ type drain layer in an edge termination region, and it is thus possible to reduce the amount of carriers accumulated.

Embodiment 4

Figure 4:
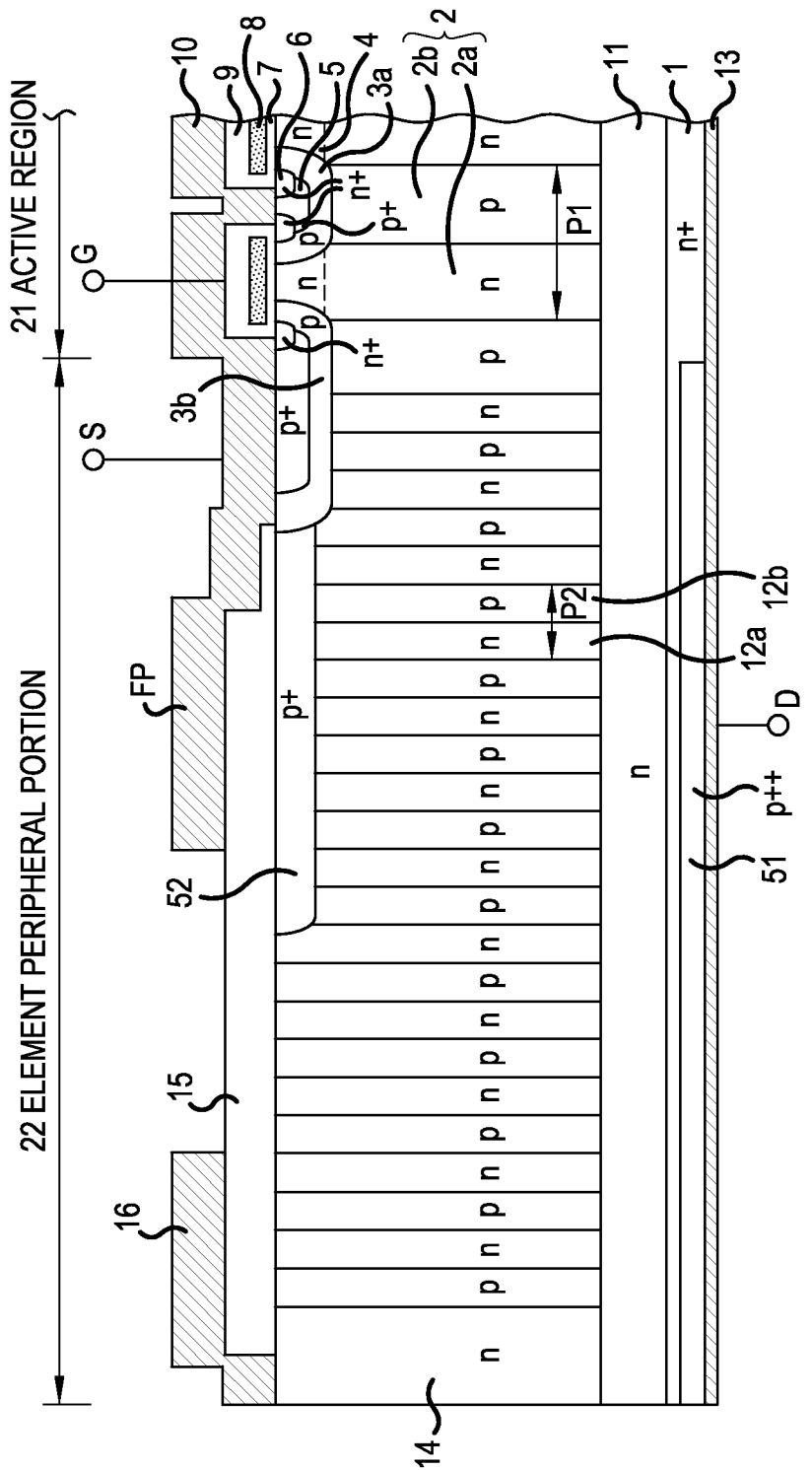
FIG. 4 is a sectional view showing the structure of a semiconductor device according to Embodiment 4.

A description will be given of the structure of a superjunction semiconductor device according to Embodiment 4. FIG. 4 is a sectional view showing the structure of the semiconductor device according to Embodiment 4. The superjunction semiconductor device according to Embodiment 4 differs from the superjunction semiconductor device according to Embodiment 3 in that the $n^+$ type drain layer 1 is interposed between a $p^{++}$ type drain region 51 and the n-type buffer layer 11. Specifically, the $p^{++}$ type drain region 51 is provided in a surface layer on the substrate back surface side of the $n^+$ type drain layer 1, and is not in contact with the n-type buffer layer 11. A p-type RESURF region 52 in contact with the outermost p-type base region 3b may be selectively provided in a surface layer on the substrate front surface side of the second parallel p-n structure. Configurations other than this of the superjunction semiconductor device according to Embodiment 4 are the same as those of the superjunction semiconductor device according to Embodiment 3.

Although not particularly limited, when the superjunction MOSFET according to Embodiment 4 is of, for example, a 600V breakdown voltage class, the dimensions and impurity concentration of each portion have the following values. The thickness of the $n^+$ type drain layer 1 is 0.5 µm, and the impurity concentration thereof is $1.0 \times 10^{18}$ cm$^{-3}$. The thickness of the $p^{++}$ type drain region 51 is 0.3 µm, and the impurity concentration thereof is $2.0 \times 10^{18}$ cm$^{-3}$. The dimensions and impurity concentrations of the other portions of the superjunction MOSFET according to Embodiment 4 are the same as those of the superjunction MOSFET according to Embodiment 1.

Next, a description will be given of a method of manufacturing the superjunction MOSFET according to Embodiment 4. In the same way as in Embodiment 1, a step of fabricating an epitaxial substrate using a general multilayer epitaxial growth method, a step of forming a front surface device structure on the front surface of the epitaxial substrate, and a step of grinding the back surface of the epitaxial substrate to reduce the thickness of the epitaxial substrate, are carried out sequentially. At this time, the MOS gate structure and front surface electrodes of the active region 21 are formed in the same way as in Embodiment 1, and the p-type RESURF region 52 is formed in the edge termination region 22, in the step of forming the front surface device structure on the front surface of the epitaxial substrate.

Next, a first ion implantation of an n-type impurity is carried out into the whole of the back surface of the epitaxial substrate (the surface of the n-type buffer layer 11), thereby forming the $n^+$ type drain layer 1 in a surface layer of the back surface of the epitaxial substrate. Next, a resist mask in which is opened a portion corresponding to a formation region of the $p^{++}$ type drain region 51 is formed on the back surface of the epitaxial substrate. Next, with the resist mask as a mask, a second ion implantation of a p-type impurity is carried out, thereby forming the $p^{++}$ type drain region 51 inside the $n^+$ type drain layer 1 to a depth less than the depth of the $n^+$ type drain layer 1.

The $p^{++}$ type drain region 51 is formed by the second ion implantation of a p-type impurity by inverting the $n^+$ type drain layer 1 exposed in the opened portion of the resist mask to a p-type. Because of this, the impurity concentration of the $p^{++}$ type drain region 51 is set to be higher than the impurity concentration of the $n^+$ type drain layer 1. Next, the resist mask used for forming the $p^{++}$ type drain region 51 is removed. Subsequently, the superjunction MOSFET shown in FIG. 4 is completed by activating the $n^+$ type drain layer 1 and $p^{++}$ type drain region 51 using thermal processing.

As heretofore described, according to Embodiment 4, it is possible to obtain the same advantages as in Embodiment 3. Also, according to Embodiment 4, an $n^+$ type drain layer is interposed between a $p^{++}$ type drain region and an n-type buffer layer, because of which it is also possible to suppress the injection of holes from the $p^{++}$ type drain region into the n-type buffer layer. Because of this, the operation of a parasitic PNP transistor formed of an outermost p-type base region, second parallel p-n structure, the n-type buffer layer, and the $p^{++}$ type drain region is suppressed, and the amount of carriers accumulated in the edge termination region 22 is further reduced. Because of this, it is possible to further increase reverse recovery capability.

Heretofore, the invention is such that an active region formed on a first main surface side of a substrate is a switching portion that includes, in the case of, for example, a vertical MOSFET, a channel diffusion layer forming an inversion layer on the first main surface side and a source region, and indicates an active portion or passive portion having functions of selecting conductivity or non-conductivity on the first main surface side of a drift portion, because of which the invention, not being limited to a MOSFET, can also be applied to a FWD, Schottky diode, or the like. Also, in each embodiment, the first conductivity type is assumed to be an n-type and the second conductivity type a p-type, but the invention is established in the same way when the first conductivity type is a p-type and the second conductivity type an n-type.

As heretofore described, the semiconductor device according to the invention is useful in a high-power semiconductor device, and in particular, useful in a power semiconductor device such that it is possible to balance high breakdown voltage and high current capability in a MOSFET, or the like, having a parallel p-n structure in a drift portion.

What is claimed is:

1. A semiconductor device having an active region, existing on a first main surface side of a substrate, that causes current to flow actively or passively, a first conductivity type low resistance layer that exists in a surface layer on a second main surface side of the substrate, and a vertical drift portion, interposed between the active region and the first conductivity type low resistance layer, through which a drift current flows in a vertical direction in an on-state and which depletes in an off-state, wherein the vertical drift portion forms a first parallel p-n structure formed by first vertical first conductivity type regions oriented in the thickness direction of the substrate and first vertical second conductivity type regions oriented in the thickness direction of the substrate being alternately and repeatedly joined, the semiconductor device comprising:
an edge termination region, interposed between the first main surface side and first conductivity type low resistance layer on the periphery of the vertical drift portion, that is largely a non-current path region in an on-state and depletes in an off-state;
a first conductivity type layer, provided from the active region to the edge termination region between the first parallel p-n structure and first conductivity type low resistance layer, that has resistance higher than that of the first conductivity type low resistance layer;
a second conductivity type low resistance layer selectively provided in a surface layer on the second main surface side in the edge termination region; and
an electrode in contact with the first conductivity type low resistance layer and the second conductivity type low resistance layer.

2. The semiconductor device according to claim 1, wherein the impurity concentration of the second conductivity type low resistance layer is higher than the impurity concentration of the first conductivity type layer.

3. The semiconductor device according to claim 1, wherein the impurity concentration of the second conductivity type low resistance layer is higher than the impurity concentration of the first conductivity type low resistance layer.

4. The semiconductor device according to claim 1, further comprising a plurality of second conductivity type base regions provided on the first main surface side, wherein
an inner end portion of the second conductivity type low resistance layer is positioned at the boundary of the active region and edge termination region, and
an outer end portion of the second conductivity type low resistance layer is positioned separated outward from an outer end portion of the second conductivity type base region of the plurality of second conductivity type base regions provided farthest to the exterior by the thickness of the vertical drift portion or more.

5. The semiconductor device according to claim 1, wherein the second conductivity type low resistance layer is provided from the boundary of the active region and edge termination region to the periphery of the edge termination region.

6. The semiconductor device according to claim 1, wherein the second conductivity type low resistance layer is provided in a surface layer on the second main surface side of the first conductivity type low resistance layer, and
the first conductivity type low resistance layer is interposed between the second conductivity type low resistance layer and the first conductivity type layer.

7. The semiconductor device according to claim 1, wherein the edge termination region forms a second parallel p-n structure formed by second vertical first conductivity type regions oriented in the thickness direction of the substrate and second vertical second conductivity type regions oriented in the thickness direction of the substrate being alternately and repeatedly joined.

8. The semiconductor device according to claim 2, wherein the edge termination region forms a second parallel p-n structure formed by second vertical first conductivity type regions oriented in the thickness direction of the substrate and second vertical second conductivity type regions oriented in the thickness direction of the substrate being alternately and repeatedly joined.

9. The semiconductor device according to claim 3, wherein the edge termination region forms a second parallel p-n structure formed by second vertical first conductivity type regions oriented in the thickness direction of the substrate and second vertical second conductivity type regions oriented in the thickness direction of the substrate being alternately and repeatedly joined.

10. The semiconductor device according to claim 4, wherein the edge termination region forms a second parallel p-n structure formed by second vertical first conductivity type regions oriented in the thickness direction of the substrate and second vertical second conductivity type regions oriented in the thickness direction of the substrate being alternately and repeatedly joined.

11. The semiconductor device according to claim 5, wherein the edge termination region forms a second parallel p-n structure formed by second vertical first conductivity type regions oriented in the thickness direction of the substrate and second vertical second conductivity type regions oriented in the thickness direction of the substrate being alternately and repeatedly joined.

12. The semiconductor device according to claim 6, wherein the edge termination region forms a second parallel p-n structure formed by second vertical first conductivity type regions oriented in the thickness direction of the substrate and second vertical second conductivity type regions oriented in the thickness direction of the substrate being alternately and repeatedly joined.

\* \* \* \* \*